(12) United States Patent
Ellis et al.

(10) Patent No.: US 12,109,753 B2
(45) Date of Patent: Oct. 8, 2024

(54) METHOD OF COVERING A HOUSING WITH A TEXTILE AND RELATED SYSTEMS AND DEVICES

(71) Applicant: META PLATFORMS TECHNOLOGIES, LLC, Menlo Park, CA (US)

(72) Inventors: Shane Michael Ellis, Bellevue, WA (US); Kristen Renee Hayenga, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 848 days.

(21) Appl. No.: 16/815,708

(22) Filed: Mar. 11, 2020

(65) Prior Publication Data

US 2021/0283827 A1    Sep. 16, 2021

(51) Int. Cl.
| | |
|---|---|
| *B29C 63/30* | (2006.01) |
| *B29C 63/00* | (2006.01) |
| *B32B 1/00* | (2024.01) |
| *B32B 1/02* | (2006.01) |
| *H04R 1/02* | (2006.01) |
| *H05K 5/02* | (2006.01) |

(52) U.S. Cl.
CPC .......... *B29C 63/30* (2013.01); *B29C 63/0017* (2013.01); *B32B 1/00* (2013.01); *H04R 1/02* (2013.01); *H05K 5/0217* (2013.01); *B32B 2439/00* (2013.01); *H04R 2201/02* (2013.01)

(58) Field of Classification Search
CPC ........ H04R 1/025; H04R 1/023; H04R 1/026; H04R 2201/029; H04R 1/02; B29C 63/30; B29C 63/00; B29C 44/1209; B29C 70/34; B29C 43/34; H05K 5/02; B32B 1/02; B32B 37/146; B32B 5/024; B32B 27/365; B32B 5/02; C08G 18/003
See application file for complete search history.

(56) References Cited

U.S. PATENT DOCUMENTS 6,564,993 B1 *  5/2003  Wassink ............... B65D 5/0055
                                                229/199
9,314,078 B1 *  4/2016  Haymond ............ H04M 1/185
(Continued)

FOREIGN PATENT DOCUMENTS

| CN | 102461352 A | 5/2012 |
| CN | 103419379 A | 12/2013 |
(Continued)

OTHER PUBLICATIONS

International Preliminary Report on Patentability for International Application No. PCT/US2021/016354, mailed Sep. 22, 2022, 7 pages.
(Continued)

*Primary Examiner* — Carolyn R Edwards
*Assistant Examiner* — Julie X Dang
(74) *Attorney, Agent, or Firm* — Greenberg Traurig, LLP

(57) ABSTRACT

A method of applying a cover to a housing may include bonding a plurality of reinforcement elements to respective inside corners of a textile having an initial shape and disposing the plurality of reinforcement elements within respective recesses at corners of the housing to secure the textile to the housing. Various other apparatuses, systems, and methods are also disclosed.

19 Claims, 10 Drawing Sheets

(56) References Cited

U.S. PATENT DOCUMENTS

| | | | | |
|---|---|---|---|---|
| 2010/0289390 A1* | 11/2010 | Kenney | ............... | H05K 5/00 |
| | | | | 156/185 |
| 2010/0289392 A1* | 11/2010 | DeWeerd | ............ | A47F 5/103 |
| | | | | 248/201 |
| 2015/0289389 A1* | 10/2015 | Conway | ............ | H05K 5/0021 |
| | | | | 220/4.01 |
| 2017/0292000 A1* | 10/2017 | Furuyama | ............ | G10K 13/00 |
| 2018/0270555 A1* | 9/2018 | Mao | ............ | H04R 1/023 |

FOREIGN PATENT DOCUMENTS

| | | | |
|---|---|---|---|
| CN | 103890262 A | 6/2014 | |
| CN | 104470389 A | 3/2015 | |
| CN | 105263347 A | 1/2016 | |
| CN | 208227219 U | 12/2018 | |
| DE | 2363447 A1 | 7/1975 | |
| GB | 2 111 905 A | 7/1983 | |

OTHER PUBLICATIONS

International Search Report and Written Opinion received for PCT Application Serial No. PCT/US2021/016354 dated May 28, 2021, 8 pages.

Office Action mailed Mar. 28, 2024 for Chinese Application No. 202180007754.8, filed Feb. 3, 2021, 8 pages.

\* cited by examiner

800

```
┌─────────────────────────────────────────────────────────┐
│ Bond a plurality of reinforcement elements to respective │
│   inside corners of a textile having an initial shape    │
│                          810                             │
└─────────────────────────────────────────────────────────┘
                            │
                            ▼
┌─────────────────────────────────────────────────────────┐
│ Dispose the plurality of reinforcement elements within   │
│ respective recesses at corners of the housing to secure  │
│                  the textile to the housing              │
│                          820                             │
└─────────────────────────────────────────────────────────┘
```

*FIG. 8*

METHOD OF COVERING A HOUSING WITH A TEXTILE AND RELATED SYSTEMS AND DEVICES

BRIEF DESCRIPTION OF THE DRAWINGS

The accompanying drawings illustrate a number of example embodiments and are a part of the specification. Together with the following description, these drawings demonstrate and explain various principles of the instant disclosure.

FIG. 8 is a flow diagram illustrating an example method of covering a housing with a seamless textile, according to at least one embodiment of the present disclosure.

Figure 1:
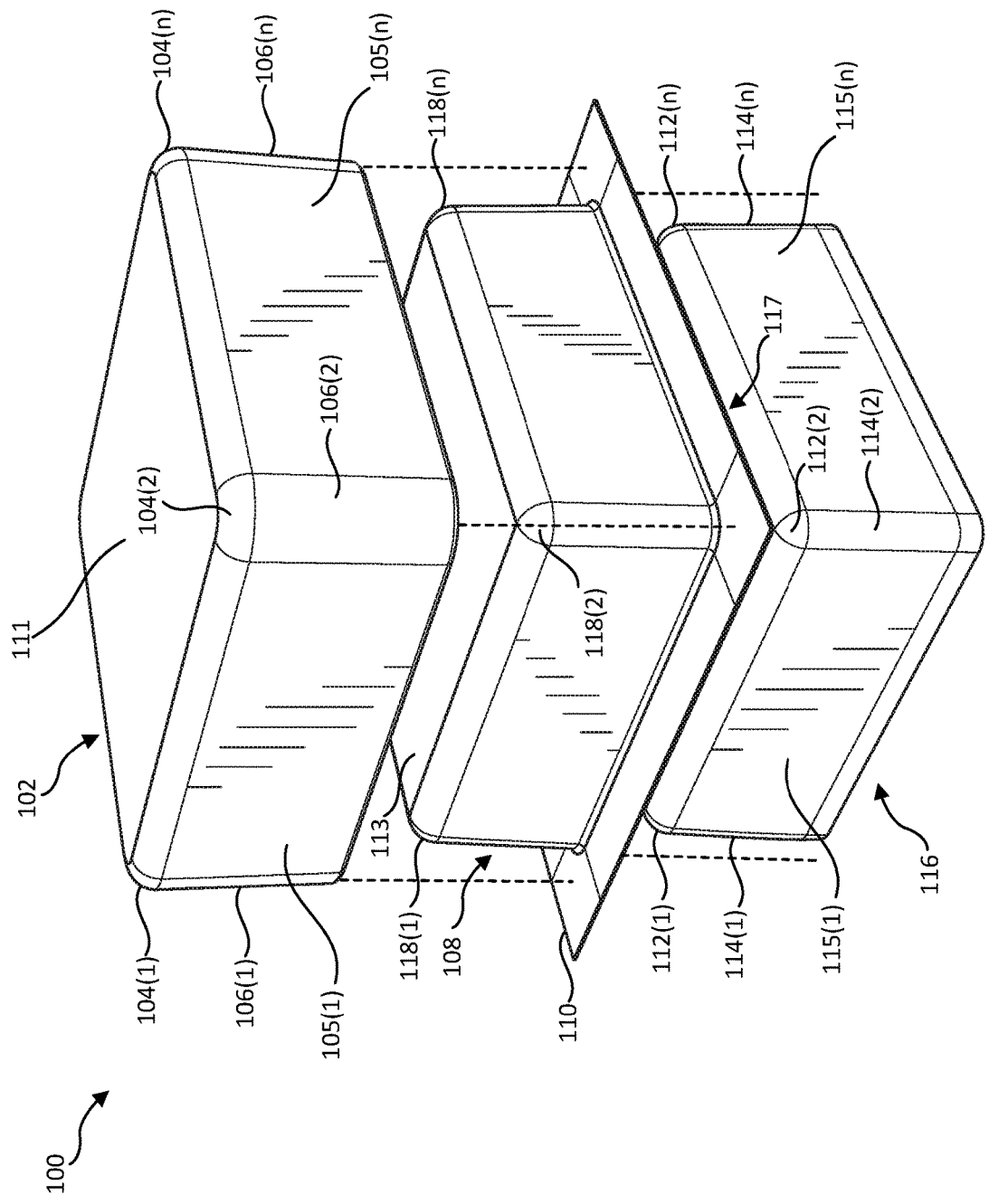
FIG. 1 illustrates an exploded view of an example assembly for forming a textile into an initial shape, according to at least one embodiment of the present disclosure.

Throughout the drawings, identical reference characters and descriptions indicate similar, but not necessarily identical, elements. While the example embodiments described herein are susceptible to various modifications and alternative forms, specific embodiments have been shown byway of example in the drawings and will be described in detail herein. However, the example embodiments described herein are not intended to be limited to the particular forms disclosed. Rather, the instant disclosure covers all modifications, equivalents, and alternatives falling within the scope of the appended claims.

DETAILED DESCRIPTION OF EXAMPLE EMBODIMENTS

Electronic devices may require a housing to support and/or protect the electronic device. The housing may be configured to provide a mounting area for the electronic device and to secure the electronic device. The housing may require a covering to protect the housing and provide an aesthetically pleasing appearance. A textile (e.g., a fabric) may be used to cover the housing. The textile may be stretched over a surface(s) of the housing with the support of reinforcement elements in corners of the textile to provide a substantially seamless and wrinkle-free textile covering.

An electronic device with a textile covered housing may include a soundbar or media bar that is a type of loudspeaker that projects audio from the housing. The housing may have any dimension and/or shape. The soundbar may include multiple electronic devices (e.g., audio speakers, amplifiers, sensors, etc.) that are disposed in the housing, which help to create a surround sound and/or stereo effect. In some examples, the textile-covered housing may be used in an artificial-reality head-mounted display system, making the system aesthetically pleasing, functional, and comfortable to create an effective user experience.

As will be described in greater detail below, the instant disclosure describes assemblies and methods for covering a housing with a textile (e.g., a substantially seamless textile). As described in greater detail below, a textile may be formed into an initial shape that is smaller than the housing that the textile will cover. Reinforcement elements may be bonded to inside corners of the textile prior to covering the housing. The textile with bonded reinforcement elements may be applied over the housing such that the reinforcement elements are disposed into respective recesses in the corners of the housing. During the process of applying the textile to the housing, a central surface of the textile may be stretched to fit over the housing, resulting in a substantially seamless and wrinkle-free covering of the housing.

Features from any of the disclosed embodiments may be used in combination with one another in accordance with the general principles described herein. These and other embodiments, features, and advantages will be more fully understood upon reading the following detailed description in conjunction with the accompanying drawings and claims.

Figure 9:
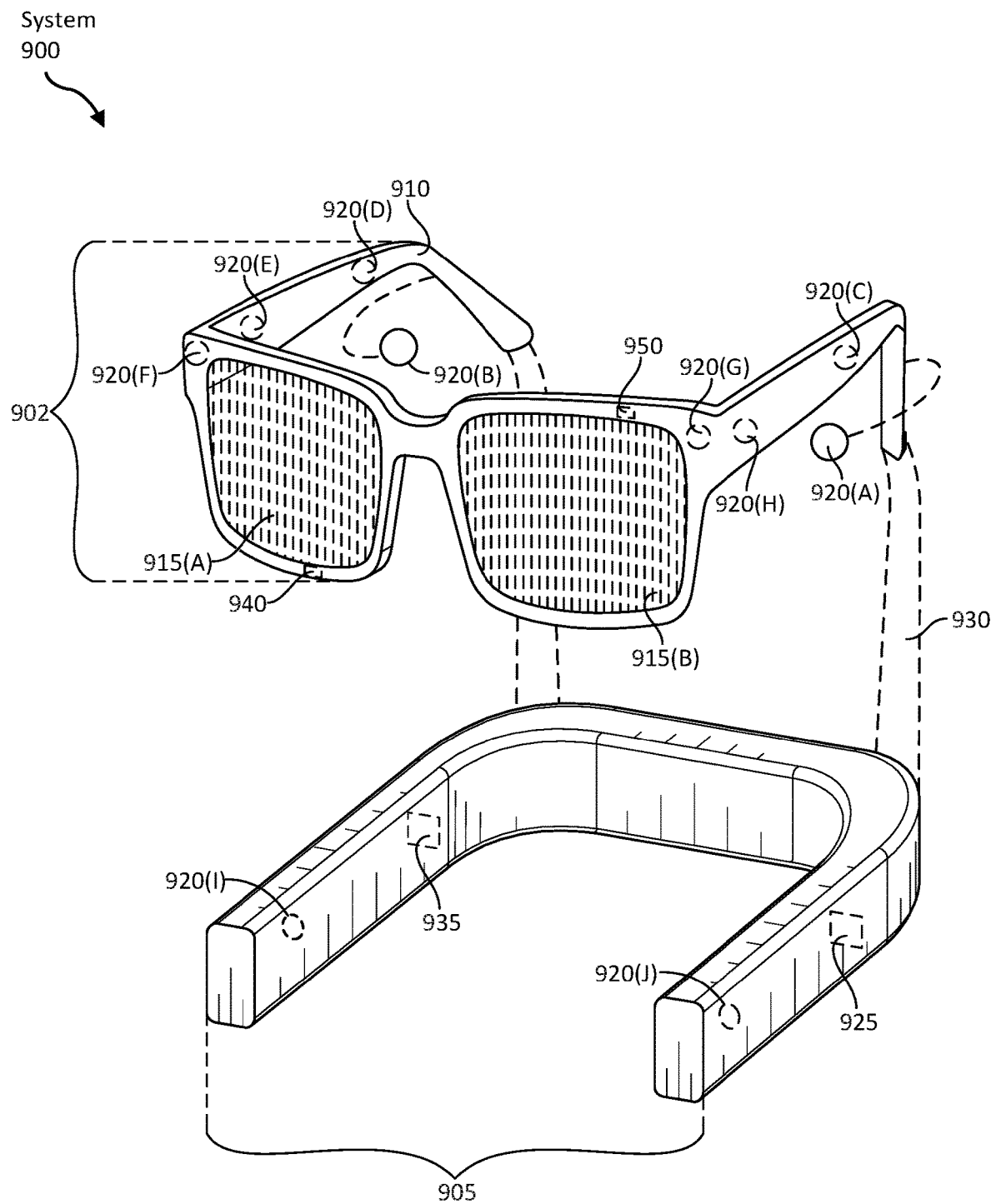
FIG. 9 is an illustration of example augmented-reality glasses that may be used in connection with embodiments of this disclosure.
Figure 10:
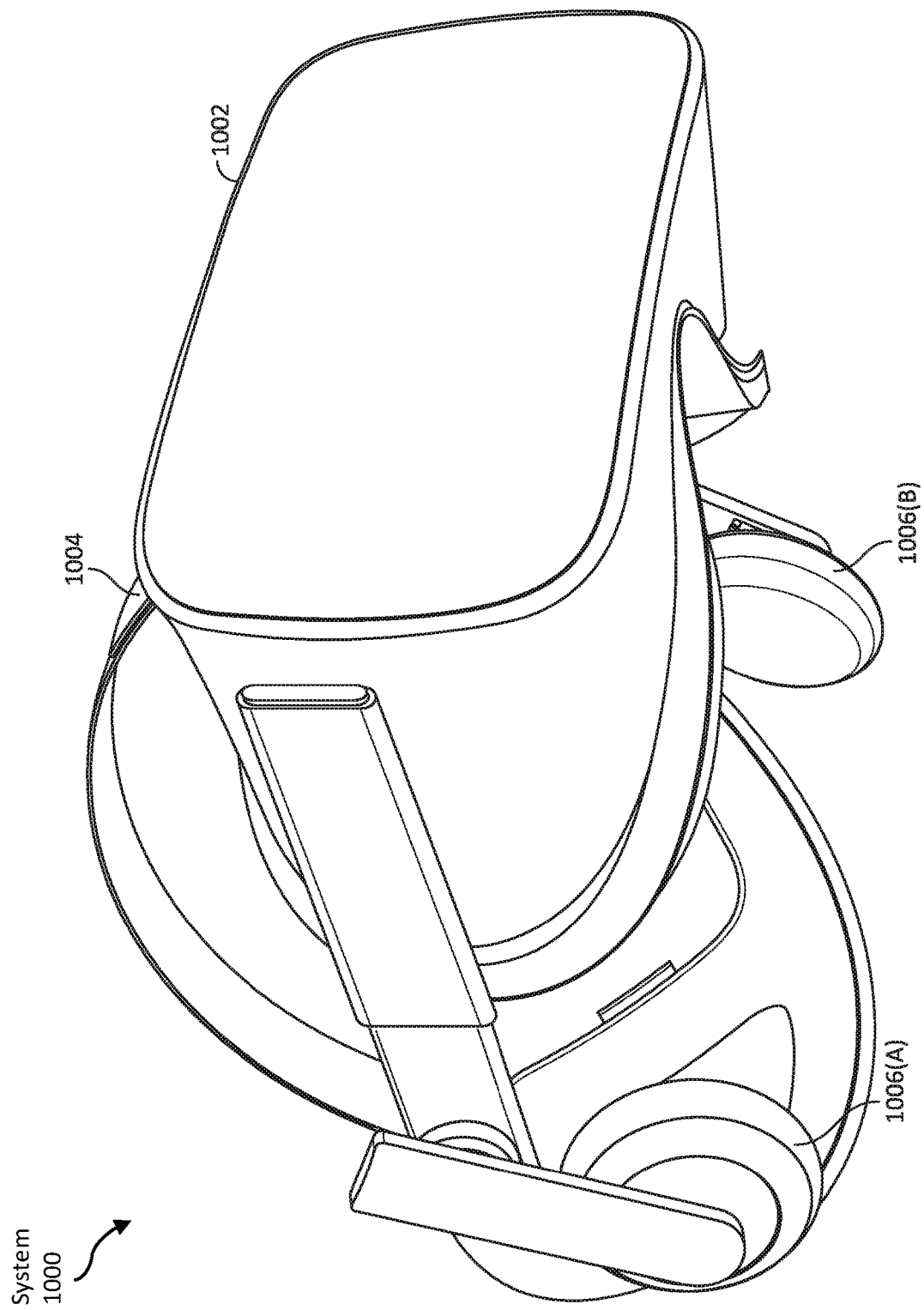
FIG. 10 is an illustration of an example virtual-reality headset that may be used in connection with embodiments of this disclosure.

The following will provide, with reference to FIGS. 1-8, detailed descriptions of assemblies and methods for covering a housing with a textile and related systems and devices. First, a description of an exploded view of an example assembly for forming a textile into an initial shape is presented in reference to FIG. 1. The description of FIGS. 2 and 3 describe an exploded view of a housing covered in a textile. The description of FIG. 4 describes a bottom perspective view of a textile having an initial shape with reinforcement elements bonded to inside corners of the textile. The description of FIG. 5 describes a central surface of a textile being stretched over a housing to couple the textile to the housing. The description of FIG. 6 describes an exploded view of a housing partially covered with a textile. The description of FIG. 7 includes features of reinforcement elements bonded to a housing. The description of FIG. 8 includes an example method of covering a housing with a substantially seamless textile. FIGS. 9 and 10 illustrate various types of example artificial-reality devices that may be used with a housing covered by a substantially seamless textile.

FIG. 1 illustrates an exploded view of an example assembly 100 for forming a textile 108 into an initial shape (e.g., pre-forming) prior to covering a housing with textile 108. Pre-forming textile 108 into the initial shape may enable subsequent steps in the process to result in a covering of the housing substantially without seams and/or wrinkles in textile 108 (e.g., a seamless textile). Textile 108 may include, without limitation, a woven fabric, a non-woven fabric, a synthetic fiber, a microfiber, a speaker grill mesh, a carbon fiber, a natural polymer material, a synthetic polymer material, a leather material, a foam material, or a combination thereof. The assembly 100 may include an inner mold 116 and an outer mold 102. The pre-forming operation may include covering inner mold 116 with textile 108 and covering textile 108 with outer mold 102. Textile 108 may be pre-formed into the initial shape by conforming textile 108 to the shape defined by a space between inner mold 116 and outer mold 102. Textile 108 may conform to the initial shape, and may remain substantially in the initial shape, such as by applying heat and/or pressure to textile 108 while positioned between inner mold 116 and outer mold 102. Textile 108 may remain positioned between inner mold 116 and outer mold 102 during the application of heat and/or pressure for a period of time for textile 108 to conform to the initial shape and to remain substantially in the initial shape after removal from inner mold 116 and outer mold 102. Inner mold 116 may include inner edges 114(1) . . . 114(n) between adjacent lateral side surfaces 115(1) . . . 115(n) of inner mold 116. Inner edges 114(1) . . . 114(n) may have a radius of curvature configured to correspond to (e.g., to match) a radius of curvature of reinforcement elements that will be bonded to textile 108 in subsequent operations of covering the housing.

In some examples, inner mold 116 may include inner corners 112(1) . . . 112(n) disposed at the intersection of two adjacent lateral side surfaces 115(1) . . . 115(n) and a central surface 117 of inner mold 116. Inner corners 112(1) . . . 112(n) may have a radius configured to pre-form corresponding corners 118(1) . . . 118(n) of textile 108 into an initial shape such that the corners 118(1) . . . 118(n) of textile 108 do not rip, tear, or deform when placed between inner mold 116 and outer mold 102. Outer mold 102 may include outer edges 106(1) . . . 106(n) between adjacent lateral side surfaces of outer mold 102. Outer edges 106(1) . . . 106(n) may have a radius of curvature configured to match a radius of curvature of reinforcement elements that will be bonded to textile 108 in subsequent operations of covering the housing. In some examples, outer mold 102 may include outer corners 104(1) . . . 104(n) disposed at the intersection of two adjacent lateral side surfaces 105(1) . . . 105(n) and a central surface 111 of outer mold 102. Outer corners 104(1) . . . 104(n) may have a radius configured to pre-form the corners of textile 108 into an initial shape such that the corners 118(1) . . . 118(n) of textile 108 do not rip, tear, or deform when placed between inner mold 116 and outer mold 102.

In some examples, the lateral side surfaces 115(1) . . . 115(n) of inner mold 116 and outer mold 102 may be drafted (e.g., tapered) such that outer mold 102 may be easily removed (e.g., without binding) from textile 108 and inner mold 116 after the pre-forming process is completed. The lateral side surfaces 115(1) . . . 115(n) of inner mold 116 and the lateral side surfaces 105(1) . . . 105(n) of outer mold 102 may be drafted such that the length of the lateral side surface 115(1) . . . 115(n) of inner mold 116 that is adjacent to the central surface 117 (e.g., the length between inner corners 112(1) and inner corner 112(2)) is shorter than the length of the lateral side surface of inner mold 116 opposite the central surface 117 (e.g., along a bottom edge of the lateral side surface 115(1) of the inner mold 116, from the perspective of FIG. 1). In some examples, textile 108 may include a flange 110 on the perimeter of textile 108. Flange 110 may also be pre-formed between inner mold 116 and outer mold 102. Flange 110 may be pre-formed such that flange 110 may be bonded to a surface of the housing in subsequent steps of the process to cover the housing in textile 108. A central surface 113 of textile 108 may be configured to have an area smaller than an area of a central surface of the housing that will be covered in textile 108, which may allow central surface 113 of textile 108 to be stretched over the central surface of the housing, resulting in a housing covered in textile 108 that may be substantially free of seams and wrinkles.

In some examples, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, at least 99% met, or fully met.

Figure 2:
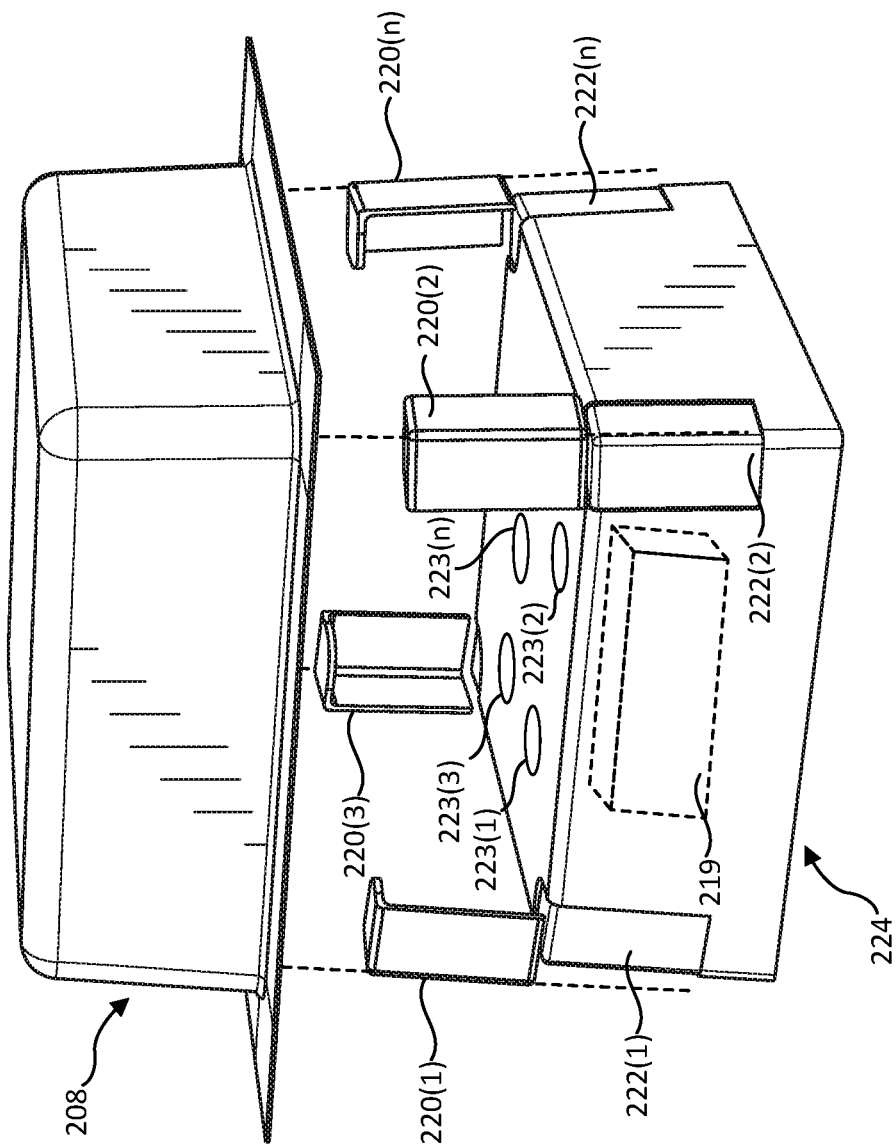
FIG. 2 illustrates an exploded view of a housing covered in a textile, according to at least one embodiment of the present disclosure.

FIG. 2 illustrates an exploded view of a housing 224 covered in a textile 208. Reinforcement elements 220(1) . . . 220(n) may be bonded to inside corners of textile 208 to facilitate the covering process. By way of example, reinforcement elements 220(1) . . . 220(n) may be bonded to the inside corners of textile 208 as described below in reference to FIG. 4. Reinforcement elements 220(1) . . . 220(n) may be bonded to the inside corners of textile 208 in order to prevent textile 208 from ripping, deforming, and/or tearing during the covering process or while in use by a user. When textile 208 is applied to (e.g., wrapped around) housing 224, reinforcement elements 220(1) . . . 220(n) may secured to (e.g., disposed in) respective recesses 222(1) . . . 222(n) at corners of housing 224. For example, reinforcement element 220(1) may be disposed in recess 222(1), reinforcement element 220(2) may be disposed in recess 222(2), reinforcement element 220(3) may be disposed in recess 222(3), and reinforcement element 220(n) may be disposed in recess 222(n). Housing 224 may include openings 223(1) . . . 223(n) configured to transmit sound waves produced by an electronic device 219 within housing 224 through openings 223(1) . . . 223(n) and textile 208. For example, electronic device 219 may include an audio transducer (e.g., a speaker) configured to produce sound waves. The sound waves may travel through openings 223(1) . . . 223(n) and textile 208 to an ambient environment. In some examples, electronic device 219 may include another audio transducer (e.g., a microphone) that receives sound waves through one or more of openings 223(1) . . . 223(n) and textile 208. Electronic device 219 may further include components (e.g., amplifiers, filters, controllers, etc.) that support the reception and transmission of sound in analog and/or digital form.

Figure 3:
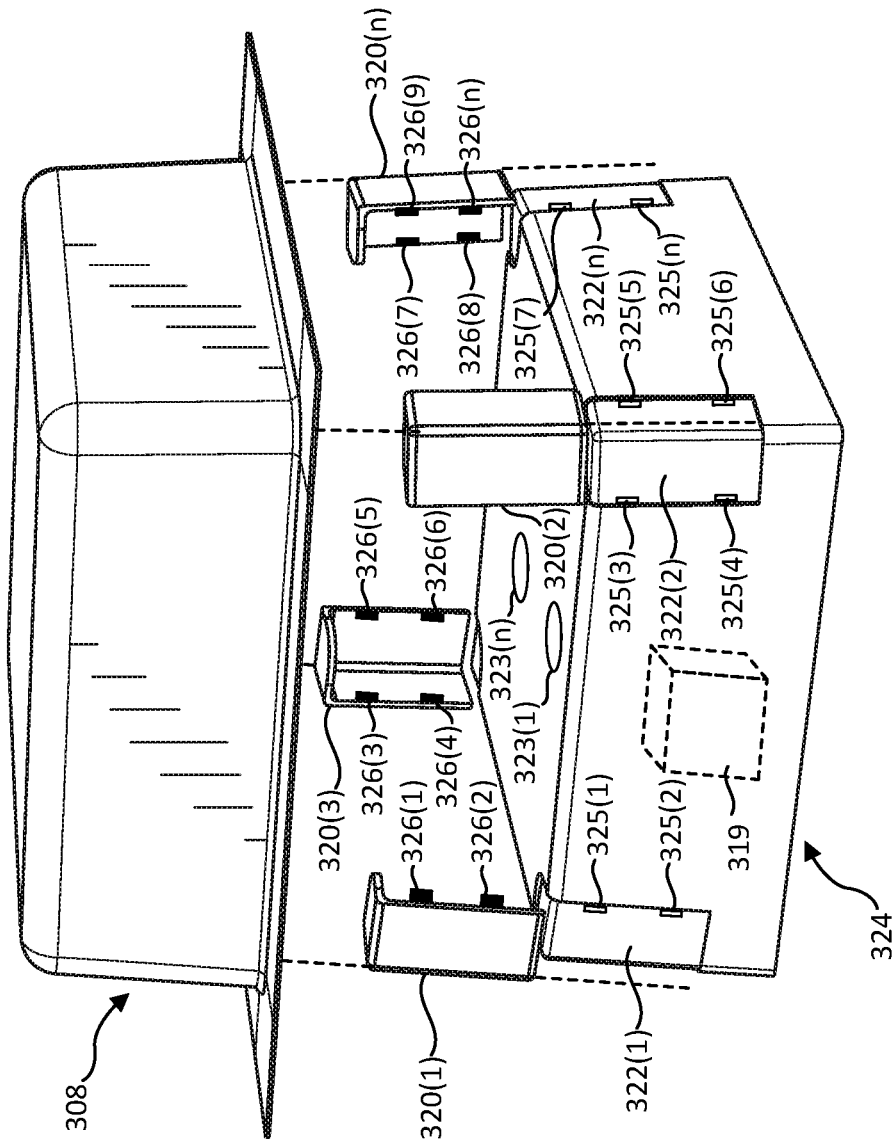
FIG. 3 illustrates an exploded view of a housing covered in a textile, according to another embodiment of the present disclosure.

FIG. 3 illustrates an exploded view of a housing 324 covered in a textile 308, according to at least one additional embodiment of the present disclosure. Reinforcement elements 320(1) . . . 320(n) may be bonded to inside corners of textile 208 to facilitate the covering process. Reinforcement elements 320(1) . . . 320(n) may be bonded to the inside corners of textile 308 as described below in reference to FIG. 4. In some examples, reinforcement elements 320(1) . . . 320(n) may be bonded (e.g., secured) to recesses 322(1) . . . 322(n) in housing 324 by securing tabs 326(1) . . . 326(n) (e.g., snap hooks). Securing tabs 326(1) . . . 326(n) may be secured in respective openings 325(1) . . . 325(n) in housing 324 by friction fit, adhesive, tension, compression, or a combination thereof. Reinforcement elements 320(1) . . . 320(n) may be bonded to the inside corners of textile 308 in order to prevent textile 308 from ripping, deforming, and/or tearing during the covering process or while in use. When textile 308 is applied to (e.g., wrapped around) housing 324, reinforcement elements 320

(1) ... 320(n) may be secured to (e.g. disposed in) recesses 322(1) ... 322(n) respectively. For example, reinforcement element 320(1) may be disposed in recess 322(1), reinforcement element 320(2) may be disposed in recess 322(2), reinforcement element 320(3) may be disposed in recess 322(3), and reinforcement element 320(n) may be disposed in recess 322(n). Housing 324 may include openings 323(1) ... 323(n) configured to transmit sound waves produced by an electronic device 319 through openings 323(1) ... 323(n) and textile 308. For example, electronic device 319 may include an audio transducer (e.g., a speaker) configured to produce sound waves. The sound waves may travel through openings 323(1) ... 323(n) and through textile 308 to an ambient environment. In some examples, electronic device 319 may include another audio transducer (e.g., a microphone) that receives sound waves through openings 323(1) ... 323(n) and textile 308. Electronic device 319 may further include components (e.g., amplifiers, filters, controllers, etc.) that support the reception and transmission of sound in analog and/or digital form.

Figure 4:
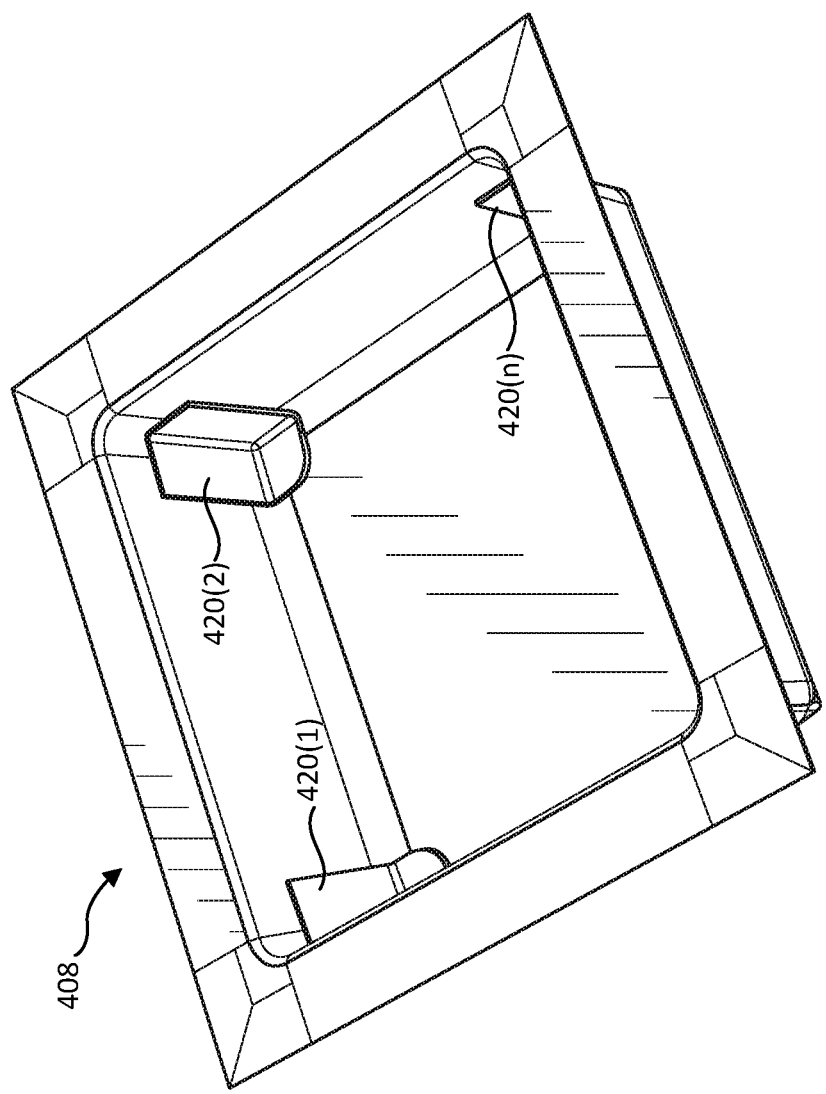
FIG. 4 illustrates a bottom perspective view of a textile having an initial shape with reinforcement elements bonded to inside corners of the textile, according to at least one embodiment of the present disclosure.

FIG. 4 illustrates a bottom perspective view of a textile 408 having an initial shape with reinforcement elements 420(1) ... 420(n) bonded to inside corners of textile 408. Bonding reinforcement elements 420(1) ... 420(n) to inside corners of textile 408 may prevent and/or reduce ripping, wrinkling, deforming, and/or tearing during the process of securing textile 408 around a housing or while in use. Reinforcement elements 420(1) ... 420(n) may be secured to inside corners of textile 408 after textile 408 has been formed into an initial shape. For example, textile 408 and/or reinforcement elements 420(1) ... 420(n) may be temporarily installed in a fixture and/or jig during the bonding process. An adhesive (e.g., a thermoset spray adhesive, a glue, an epoxy, etc.) may be applied (e.g., sprayed, extruded) onto a surface of reinforcement elements 420(1) ... 420(n) and/or the inside corners of textile 408 to bond reinforcement elements 420(1) ... 420(n) to textile 408. Any or all of the adhesive, reinforcement elements 420(1) ... 420(n), or textile 408 may be heated during the adhesive application process. After an initial bonding process, reinforcement elements 420(1) ... 420(n) and textile 408 may be subjected to a post process (e.g., heating, pressure, drying, etc.) in order to cure the adhesive and increase the strength of the bond.

Figure 5:
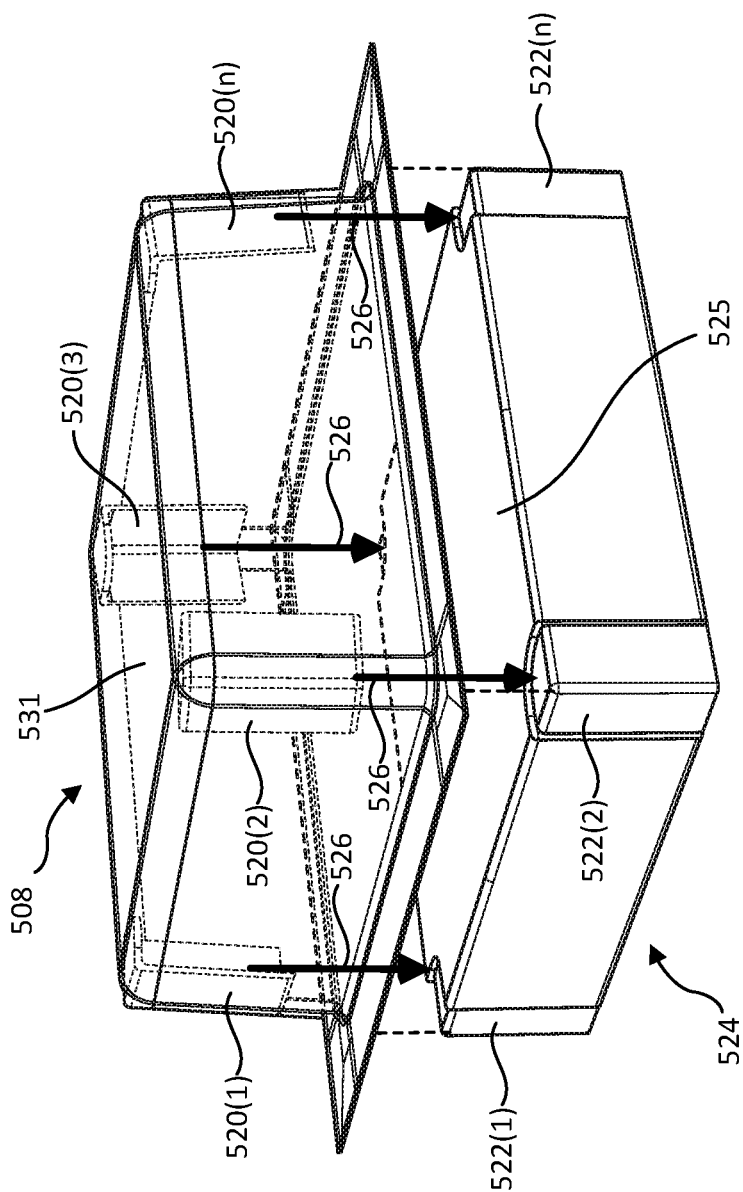
FIG. 5 illustrates a central surface of a textile being stretched over a housing to couple the textile to the housing, according to at least one embodiment of the present disclosure.

FIG. 5 illustrates a central surface 531 of a textile 508 being stretched over a housing 524 to fit textile 508 over housing 524. FIG. 5 shows textile 508 with reinforcement elements 520(1) ... 520(n) bonded to inside corners of textile 508 being placed over housing 524 prior to securing textile 508 to housing 524. Since central surface 531 of textile 508 was initially shaped (e.g., with the assembly 100 of FIG. 1) to be smaller than the central surface 525 of housing 524, central surface 531 may be stretched to create tension in central surface 531 when central surface 531 is applied onto housing 524. Textile 508 may be applied to housing 524 by applying (e.g., spraying, extruding) an adhesive (e.g., a thermoset spray adhesive, a glue, an epoxy, etc.) to the inside surfaces of reinforcement elements 520(1) ... 520(n) and/or recesses 522(1) ... 522(n) and installing (e.g., sliding) textile 508 onto housing 524 in the direction indicated by the arrows 526 shown in FIG. 5. Any or all of the adhesive, reinforcement elements 520(1) ... 520(n), housing 524, or textile 508 may be heated during the adhesive application process. After an initial bonding process, reinforcement elements 520(1) ... 520(n), textile 508, and housing 524 may be subjected to a post process (e.g., heating, pressure, drying, etc.) as an assembly in order to cure the adhesive and increase the strength of the bond. Using the above described process, textile 508 may be applied to housing 524 such that textile 508 is aesthetically pleasing and substantially free of seams and wrinkles.

Figure 6:
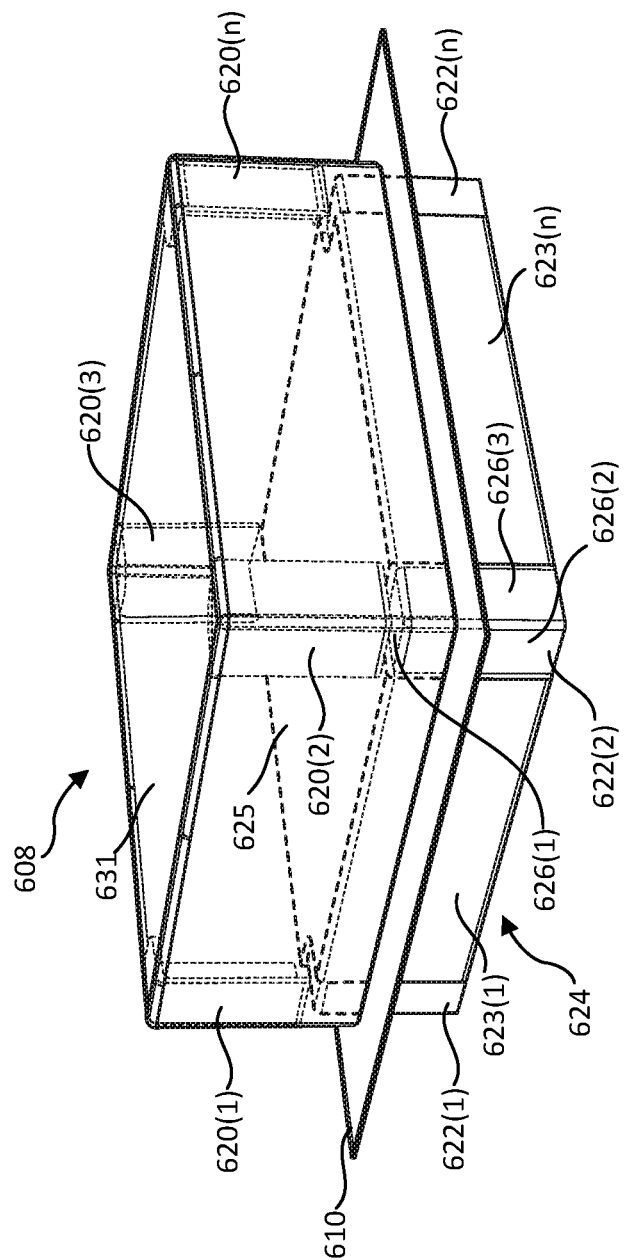
FIG. 6 illustrates an exploded view of a housing partially covered with a textile, according to at least one embodiment of the present disclosure.

FIG. 6 illustrates an exploded view of a housing 624 partially covered with a textile 608. FIG. 6 shows textile 608 with reinforcement elements 620(1) ... 620(n) bonded to inside corners of textile 608 placed over housing 624 during the process of securing textile 608 to housing 624. FIG. 6. shows textile 608 partially covering housing 624 just prior to reinforcement elements 620(1) ... 620(n) engaging with recesses 622(1) ... 622(n) in housing 624 during the process of securing textile 608 to housing 624. Since central surface 631 of textile 608 was initially shaped (e.g., with the assembly 100 of FIG. 1) to be smaller than the central surface 625 of housing 624, central surface 631 may be stretched to create tension in central surface 631 when central surface 631 is applied onto housing 624. Housing 624 may include central surface 625, four lateral side surfaces 623(1) ... 623(n), and recesses 622(1) ... 622(n) at the corners of housing 624. The corners of housing 624 may be defined at intersections of central surface 625 with two adjacent lateral side surfaces 623(1) ... 623(n) of the four lateral side surfaces. Each of recesses 622(1) ... 622(n) may be defined by a first recess 626(1) in central surface 625, a second recess 626(2) in a first lateral side surface 623(1) of the housing 624, and a third recess 626(3) in a second, adjacent lateral side surface 623(2) of housing 624. Reinforcement elements 620(1) ... 620(n) may be moved in a direction (e.g., radially) away from central surface 631 of textile 608 thereby stretching central surface 631 when applying textile 608 to housing 624. Textile 608 may be applied to housing 624 by applying (e.g., spraying, extruding) an adhesive (e.g., a thermoset spray adhesive, a glue, an epoxy, etc.) to the inside surfaces of reinforcement elements 620(1) ... 620(n) and/or recesses 622(1) ... 622(n) and installing (e.g., sliding) textile 608 onto housing 624. Any or all of the adhesive, reinforcement elements 620(1) ... 620(n), housing 624, or textile 608 may be heated during the adhesive application process. After an initial bonding process, reinforcement elements 620(1) ... 620(n), textile 608, and housing 624 may be subjected to a post process (e.g., heating, pressure, drying, etc.) as an assembly in order to cure the adhesive and increase the strength of the bond.

In some examples, after applying textile 608 to housing 624, flange 610 of textile 608 may be applied to at least a portion of a surface of housing 624, such as a surface that is opposite to central surface 631. The portion of the surface of housing 624 that is opposite to central surface 631 may be along an edge (e.g., a bottom edge) of housing 624. Flange 610 of textile 608 may be applied to the corresponding surface of housing 624 by applying (e.g., spraying, extruding) an adhesive (e.g., a thermoset spray adhesive, a glue, an epoxy, etc.) to flange 610 of textile 608 and/or to the surface of housing 624. Flange 610 of textile 608 may be applied to the surface of housing 624 using manual and/or automated tooling. Using the above described process, textile 608 may be applied to at least a portion of all exposed surfaces of housing 624 such that textile 608 is aesthetically pleasing and substantially free of seams and wrinkles.

Figure 7:
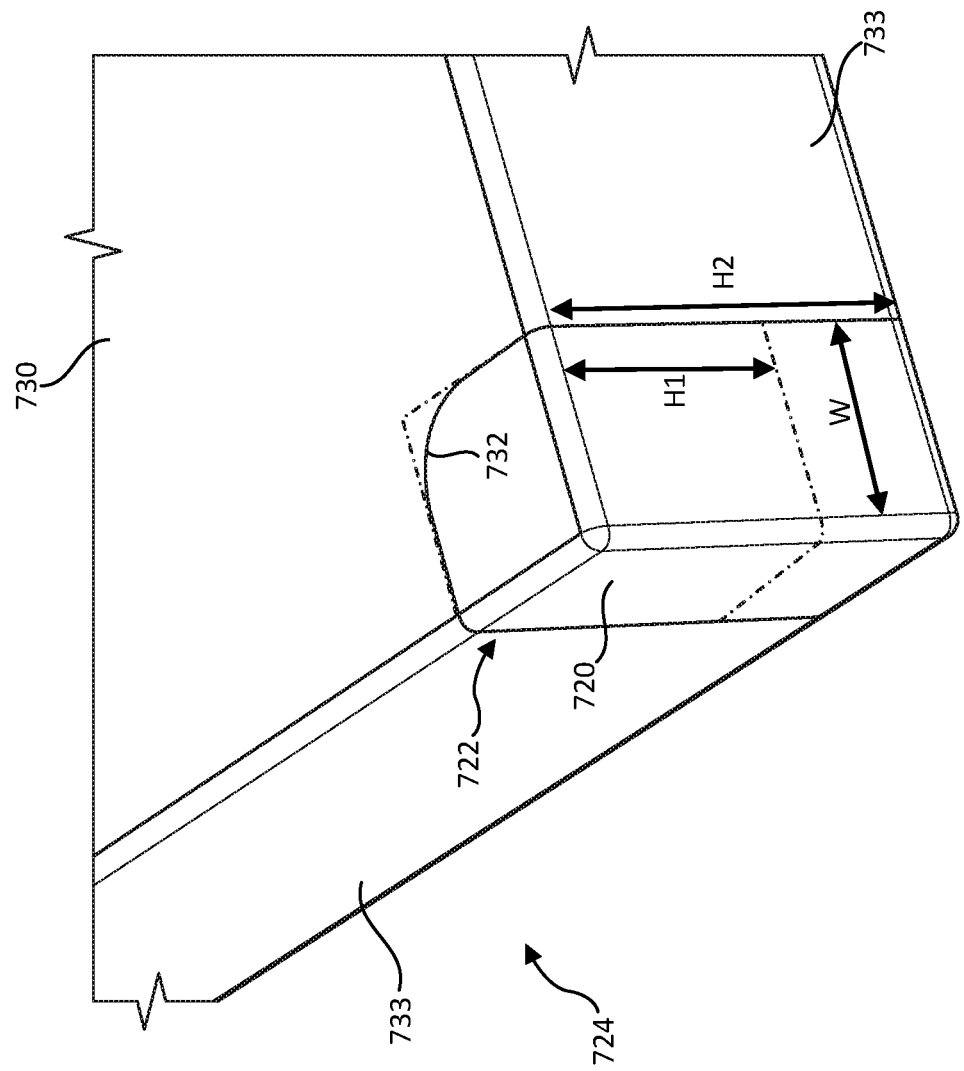
FIG. 7 illustrates a detailed perspective view of a reinforcement element bonded to a housing, according to at least one embodiment of the present disclosure.

FIG. 7 illustrates a detailed perspective view of reinforcement element 720 bonded to housing 724. Although FIG. 7 shows only one corner of housing 724 with reinforcement element 720 in a recess 722 of housing 724, housing 724 may have multiple corners as shown above in reference to FIGS. 1-6. Reinforcement element 720 may have a rounded edge 732 dimensioned to provide a smooth interface between the central surface of the textile that is not bonded to reinforcement element 720 and the corner of the surface of the textile that is bonded to reinforcement element 720. Rounded edge 732 may provide a substantially smooth, consistent, and wrinkle-free appearance to the textile when it is stretched over housing 724. As described above with reference to FIG. 4, reinforcement element 720 may be secured (e.g., glued) to inside corners of the textile after the textile has been formed into an initial shape thereby preventing the textile from stretching in the area glued to reinforcement element 720. In some examples, a width W of reinforcement element 720 to be positioned along a corresponding lateral side 733 of housing 724 may be configured and dimensioned to based on the area of lateral side 733 that the textile is stretched over. Since a portion of the textile that is bonded to reinforcement element 720 is prevented from stretching due to the bonding, decreasing a width W of reinforcement element 720 may increase the amount of textile that may be stretched over an area of lateral side 733 when the textile is applied to the housing. The width W of the reinforcement element 720 may be related to a length of corresponding lateral side 733. For example, reinforcement element 720 having a relatively large width W may be used with housing 724 having a relatively long lateral side 733. In some examples, width W may be less than one inch, less than 0.75 inches, less than 0.5 inches, or less than 0.25 inches.

In some examples, a height H1 of reinforcement element 720 on lateral sides of housing 724 may be configured and dimensioned to inhibit (e.g., reduce or eliminate) the presence of seams in the textile applied to housing 724. Height H1 may be the height of recess 722 on lateral side 733. Height H1 may also be a height of an area where an adhesive is applied to an inner surface of reinforcement element 720 and/or the surface of recess 722 when reinforcement element 720 is bonded to housing 724. Height H1 may also be configured and dimensioned to reduce the visibility of any seams that may be present in the textile applied to housing 724. Height H1 may be dimensioned to be a portion of the entire height H2 of the lateral sides 733 or height H1 may be equal to an entire height H2 of the lateral sides 733. By dimensioning height H1 to be equal to height H2 (e.g., extending down the entire height of lateral side 733), the number of seams in the textile and the visibility of the seams may be reduced.

Any of housings 224, 324, 524, 624, or 724 covered with a textile as described above may be used to house an electronic device. The textile covering may be substantially wrinkle-free, seamless, and may provide an aesthetically pleasing housing for the electronic device. In some examples, the textile-covering processes described above may be used to cover an electronic housing associated with components of an artificial-reality system, such as system 900 described below with reference to FIG. 9 or system 1000 described below with reference to FIG. 10. In some examples, the textile-covering processes described above may be used to cover an audio speaker housing. The textile-covered speaker housing may include a soundbar speaker associated with an entertainment system and/or an artificial-reality system (e.g., a head-mounted display element of an artificial-reality system).

FIG. 8 is a flow diagram illustrating a method 800 of applying a textile cover to a housing. At operation 810, the method 800 may include bonding a plurality of reinforcement elements to respective inside corners of a textile having an initial shape. Operation 810 may be performed in a variety of ways, for example, the textile and/or the reinforcement elements may be temporarily installed in a fixture or jig during the bonding process. An adhesive (e.g., a thermoset spray adhesive, a glue, an epoxy, etc.) may be applied (e.g., sprayed, extruded) onto the reinforcement elements and/or the inside corners of the textile to bond the reinforcement elements to the textile. Any or all of the adhesive, the reinforcement elements, or the textile may be heated during the adhesive application process. After an initial bonding process, the reinforcement elements and the textile may be subjected to a post process (e.g., heating, pressure, drying, etc.) in order to cure the adhesive and increase the strength of the bond.

At operation 820, method 800 may include disposing the plurality of reinforcement elements within respective recesses at corners of the housing to secure the textile to the housing. Operation 820 may be performed in a variety of ways. For example, the textile may be secured to the housing by applying (e.g., spraying, extruding) an adhesive (e.g., a thermoset spray adhesive, a glue, an epoxy, etc.) to the inside surfaces of the reinforcement elements and/or the recesses at the corners of the housing and installing (e.g., sliding) the textile onto the housing. A central surface of the textile may be stretched to create tension in the central surface when the textile is secured to the housing, which may result in a substantially seamless and wrinkle-free textile covering.

Accordingly, the present disclosure includes devices, systems, and methods that may be employed to improve and provide a substantially seamless and wrinkle-free textile covering for a housing.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 900 in FIG. 9) or that visually immerses a user in an artificial reality (such as, e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Turning to FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented-reality system 900 may include one or more sensors, such as sensor 940. Sensor 940 may generate measurement signals in response to motion of augmented-reality system 900 and may be located on substantially any portion of frame 910. Sensor 940 may represent one or more of a variety of different sensing mechanisms, such as a position sensor, an inertial measurement unit (IMU), a depth camera assembly, a structured light emitter and/or detector, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

In some examples, augmented-reality system 900 may also include a microphone array with a plurality of acoustic transducers 920(A)-920(J), referred to collectively as acoustic transducers 920. Acoustic transducers 920 may represent transducers that detect air pressure variations induced by sound waves. Each acoustic transducer 920 may be configured to detect sound and convert the detected sound into an electronic format (e.g., an analog or digital format). The microphone array in FIG. 10 may include, for example, ten acoustic transducers: 920(A) and 920(B), which may be designed to be placed inside a corresponding ear of the user, acoustic transducers 920(C), 920(D), 920(E), 920(F), 920 (G), and 920(H), which may be positioned at various locations on frame 910, and/or acoustic transducers 920(I) and 920(J), which may be positioned on a corresponding neckband 905.

In some embodiments, one or more of acoustic transducers 920(A)-(F) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer 920, or some combination thereof.

Acoustic transducers 920(A) and 920(B) may be positioned on different parts of the user's ear, such as behind the pinna, behind the tragus, and/or within the auricle or fossa. Or, there may be additional acoustic transducers 920 on or surrounding the ear in addition to acoustic transducers 920 inside the ear canal. Having an acoustic transducer 920 positioned next to an ear canal of a user may enable the microphone array to collect information on how sounds arrive at the ear canal. By positioning at least two of acoustic transducers 920 on either side of a user's head (e.g., as binaural microphones), augmented-reality device 900 may simulate binaural hearing and capture a 3D stereo sound field around about a user's head. In some embodiments, acoustic transducers 920(A) and 920(B) may be connected to augmented-reality system 900 via a wired connection 930, and in other embodiments acoustic transducers 920(A) and 920(B) may be connected to augmented-reality system 900 via a wireless connection (e.g., a Bluetooth connection). In still other embodiments, acoustic transducers 920(A) and 920(B) may not be used at all in conjunction with augmented-reality system 900.

Acoustic transducers 920 on frame 910 may be positioned in a variety of different ways, including along the length of the temples, across the bridge, above or below display devices 915(A) and 915(B), or some combination thereof. Acoustic transducers 920 may also be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers, other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(I) and 920(J)) that are part of the microphone array (or potentially form their own microphone subarray). Neckband 905 may also include a controller 925 and a power source 935.

Acoustic transducers 920(I) and 920(J) of neckband 905 may be configured to detect sound and convert the detected sound into an electronic format (analog or digital). In the embodiment of FIG. 9, acoustic transducers 920(I) and 920(J) may be positioned on neckband 905, thereby increasing the distance between the neckband acoustic transducers 920(I) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920 (D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on neckband 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002, a facial interface (e.g., facial interface 200, 307, 407, 507, 607 described above) with pegs for securing the facial interface to a frame of front rigid body 1002, and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 900 and/or virtual-reality system 1000 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some the artificial-reality systems described herein may include one or more projection systems. For example, display devices in augmented-reality system 900 and/or virtual-reality system 1000 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 900 and/or virtual-reality system 1000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments.

By way of non-limiting examples, the following embodiments are included in the present disclosure.

Example 1: A method of applying a cover to a housing, including bonding a plurality of reinforcement elements to respective inside corners of a textile having an initial shape and disposing the plurality of reinforcement elements within respective recesses at corners of the housing to secure the textile to the housing.

Example 2: The method of Example 1, further comprising forming the textile into the initial shape.

Example 3: The method of Example 1 or Example 2, wherein forming the textile into the initial shape comprises placing the textile into a mold assembly comprising an inner mold element and an outer mold element, and applying at least one of heat or pressure to the textile.

Example 4: The method of any of Examples 1 through 3, wherein an area of a central surface of an inner mold element is less than an area of a corresponding central surface of the housing extending between the corners of the housing and placing the textile into the inner mold element comprises positioning corners of the central surface of the inner mold element adjacent to the inside corners of the textile.

Example 5: The method of any of Examples 1 through 4, wherein the inner mold element comprises a plurality of drafted sidewalls adjacent to the central surface of the mold.

Example 6: The method of any of Examples 1 through 5, wherein outside corners of the inner mold element have a rounded shape.

Example 7: The method of any of Examples 1 through 6, wherein the disposing of the plurality of reinforcement elements within respective recesses at the corners of the housing comprises stretching a central portion of the textile.

Example 8: The method of any of Examples 1 through 7, further comprising adhering the plurality of reinforcement elements within the respective recesses at the corners of the housing by applying an adhesive to at least one of the plurality of reinforcement elements or the respective recesses at the corners of the housing.

Example 9: The method of any of Examples 1 through 8, further comprising forming the plurality of reinforcement elements to exhibit a lateral width of less than 0.5 inch.

Example 10: The method of any of Examples 1 through 9, wherein the bonding of the plurality of reinforcement elements to the respective inside corners of the textile comprises placing the plurality of reinforcement elements in a fixture, applying an adhesive to respective surfaces of the plurality of reinforcement elements, and placing the textile over the adhesive applied to the surfaces of the plurality of reinforcement elements.

Example 11: A covered housing including a housing having respective recesses at corners of the housing and a textile having a plurality of reinforcement elements bonded to respective inside corners of the textile, wherein the plurality of reinforcement elements are disposed within the respective recesses at corners of the housing to secure the textile to the housing.

Example 12: The covered housing of Example 11, wherein the textile has an initial shape prior to securing the textile to the housing.

Example 13: The covered housing of Example 11 or Example 12, wherein the housing further comprises holes extending into a surface of the recesses and the reinforcement elements include respective inward protrusions sized and shaped for insertion into the holes.

Example 14: The covered housing of any of Examples 11 through 13, wherein the textile comprises at least one of a woven fabric, a non-woven fabric, a synthetic fiber, a microfiber, a speaker grill mesh, a carbon fiber, a natural polymer material, a synthetic polymer material, a leather material, or a foam material.

Example 15: The covered housing of any of Examples 11 through 14, wherein each of the recesses of the housing is defined by a first recess in a central surface of the housing, a second recess in a first lateral side surface of the housing, and a third recess in a second, adjacent lateral side surface of the housing.

Example 16: The covered housing of any of Examples 11 through 15, wherein the housing comprises a central surface and at least two lateral side surfaces, wherein the corners of the housing are defined at intersections of the central surface with two adjacent lateral side surfaces.

Example 17: The covered housing of any of Examples 11 through 16, wherein a central portion of the textile is under tension.

Example 18: The covered housing of any of Examples 11 through 17, further comprising an adhesive, wherein securing the textile to the housing comprises adhering the plurality of reinforcement elements within the respective recesses at the corners of the housing by applying the adhesive to at least one of the plurality of reinforcement elements or the respective recesses at the corners of the housing.

Example 19: The covered housing of any of Examples 11 through 18, wherein the plurality of reinforcement elements have a lateral width positioned along a corresponding lateral side of the housing, wherein the lateral width is less than 0.5 inch.

Example 20: A covered housing for an electronic device including a housing having respective recesses at corners of the housing, a textile having a plurality of reinforcement elements bonded to respective inside corners of the textile, wherein the plurality of reinforcement elements are disposed within the respective recesses at corners of the housing to secure the textile to the housing and the housing comprises at least one opening configured to transmit sound waves produced by the electronic device through the at least one opening and the textile.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method of applying a cover to a housing, comprising:
   bonding a plurality of reinforcement elements to respective inside corners of a textile after the textile has been formed into an initial shape; and
   disposing the plurality of reinforcement elements within respective outward-facing recesses at corners of the housing to secure the textile to the housing and to cover at least a portion of the housing with the textile including to cover the corners of the housing with the textile, wherein each of the recesses of the housing is defined by a first recess in a central surface of the housing, a second recess in a first lateral side surface of the housing, and a third recess in a second, adjacent lateral side surface of the housing.

2. The method of claim 1, further comprising forming the textile into the initial shape.

3. The method of claim 2, wherein forming the textile into the initial shape comprises:
   placing the textile into a mold assembly comprising an inner mold element and an outer mold element; and
   applying at least one of heat or pressure to the textile.

4. The method of claim 3, wherein:
   an area of a central surface of an inner mold element is less than an area of a corresponding central surface of the housing extending between the corners of the housing; and
   placing the textile into the mold assembly comprises positioning corners of the central surface of the inner mold element adjacent to the inside corners of the textile.

5. The method of claim 4, wherein the inner mold element comprises a plurality of drafted sidewalls adjacent to the central surface of the inner mold element.

6. The method of claim 3, wherein outside corners of the inner mold element have a rounded shape.

7. The method of claim 1, wherein the disposing of the plurality of reinforcement elements within respective recesses at the corners of the housing comprises stretching a central portion of the textile.

8. The method of claim 1, further comprising adhering the plurality of reinforcement elements within the respective recesses at the corners of the housing by applying an adhesive to at least one of the plurality of reinforcement elements or the respective recesses at the corners of the housing.

9. The method of claim 1, further comprising forming the plurality of reinforcement elements to exhibit a lateral width of less than 0.5 inch.

10. The method of claim 1, wherein the bonding of the plurality of reinforcement elements to the respective inside corners of the textile comprises:
    placing the plurality of reinforcement elements in a fixture;
    applying an adhesive to respective surfaces of the plurality of reinforcement elements; and
    placing the textile over the adhesive applied to the surfaces of the plurality of reinforcement elements.

11. A covered housing comprising:
    a housing having respective outward-facing recesses at corners of the housing, wherein each of the recesses of the housing is defined by a first recess in a central surface of the housing, a second recess in a first lateral side surface of the housing, and a third recess in a second, adjacent lateral side surface of the housing;
    a textile covering at least a portion of the housing including the corners of the housing; and a plurality of reinforcement elements bonded to respective inside corners of the textile after the textile has been formed into an initial shape, wherein the plurality of reinforcement elements are disposed within the respective recesses at the corners of the housing to secure the textile to the housing.

12. The covered housing of claim 11, wherein the textile has an initial shape prior to securing the textile to the housing.

13. The covered housing of claim 11, wherein the housing further comprises holes extending into a surface of the recesses and the reinforcement elements include respective inward protrusions sized and shaped for insertion into the holes.

14. The covered housing of claim 11, wherein the textile comprises at least one of:
- a woven fabric,
- a non-woven fabric,
- a synthetic fiber,
- a microfiber,
- a speaker grill mesh,
- a carbon fiber,
- a natural polymer material,
- a synthetic polymer material,
- a leather material, or
- a foam material.

15. The covered housing of claim 11, wherein the corners of the housing are defined at intersections of the central surface with two adjacent lateral side surfaces.

16. The covered housing of claim 11, wherein a central portion of the textile is under tension.

17. The covered housing of claim 11, further comprising an adhesive, wherein securing the textile to the housing comprises adhering the plurality of reinforcement elements within the respective recesses at the corners of the housing by applying the adhesive to at least one of the plurality of reinforcement elements or the respective recesses at the corners of the housing.

18. The covered housing of claim 11, wherein the plurality of reinforcement elements have a lateral width positioned along a corresponding lateral side of the housing, wherein the lateral width is less than 0.5 inch.

19. A covered housing for an electronic device comprising:
- a housing having respective outward-facing recesses at corners of the housing, wherein each of the recesses of the housing is defined by a first recess in a central surface of the housing, a second recess in a first lateral side surface of the housing, and a third recess in a second, adjacent lateral side surface of the housing;
- a textile covering at least a portion of the housing including the corners of the housing; and
- a plurality of reinforcement elements bonded to respective inside corners of the textile after the textile has been formed into an initial shape, wherein:
    - the plurality of reinforcement elements are disposed within the respective recesses at corners of the housing to secure the textile to the housing; and
    - the housing comprises at least one opening configured to transmit sound waves produced by the electronic device through the at least one opening and the textile.

\* \* \* \* \*